(12) United States Patent
Luu et al.

(10) Patent No.: US 10,276,504 B2
(45) Date of Patent: Apr. 30, 2019

(54) PRECLEAN AND DEPOSITION METHODOLOGY FOR SUPERCONDUCTOR INTERCONNECTS

(71) Applicants: Vivien Luu, Linthicum, MD (US); Christopher F. Kirby, Gambrills, MD (US); Brian Wagner, Baltimore, MD (US); Michael Rennie, Ashland, VA (US)

(72) Inventors: Vivien Luu, Linthicum, MD (US); Christopher F. Kirby, Gambrills, MD (US); Brian Wagner, Baltimore, MD (US); Michael Rennie, Ashland, VA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/597,565

(22) Filed: May 17, 2017

(65) Prior Publication Data

US 2018/0337138 A1 Nov. 22, 2018

(51) Int. Cl.
*H01L 23/532* (2006.01)
*H01L 21/00* (2006.01)
(Continued)

(52) U.S. Cl.
CPC .. *H01L 23/53285* (2013.01); *H01L 21/02063* (2013.01); *H01L 21/7684* (2013.01);
(Continued)

(58) Field of Classification Search
CPC ......... H01L 21/02063; H01L 21/76807; H01L 21/76814; H01L 21/7684; H01L 21/76877;
(Continued)

(56) References Cited

U.S. PATENT DOCUMENTS

| 4,953,005 A | 8/1990 | Carlson et al. |
| 4,960,751 A | 10/1990 | Yamazaki |

(Continued)

FOREIGN PATENT DOCUMENTS

| EP | 0285445 A2 | 10/1988 |
| JP | S6281075 A | 4/1987 |

(Continued)

OTHER PUBLICATIONS

International Search Report and Written Opinion corresponding to Application No. PCT/US2018/031139, dated Sep. 18, 2018.
(Continued)

*Primary Examiner* — Nikolay K Yushin
(74) *Attorney, Agent, or Firm* — Tarolli, Sundheim, Covell & Tummino LLP

(57) ABSTRACT

A method is provided of forming a superconductor interconnect structure. The method comprises forming a dielectric layer overlying a substrate, forming an interconnect opening in the dielectric layer, and moving the substrate to a deposition chamber. The method further comprises performing a cleaning process on the top surface of the dielectric layer and in the interconnect opening while in the deposition chamber, and depositing a superconducting metal in the interconnect opening while in the deposition chamber to form a superconducting element in the superconductor interconnect structure.

20 Claims, 6 Drawing Sheets

(51) Int. Cl.
  *H01L 23/522* (2006.01)
  *H01L 21/768* (2006.01)
  *H01L 21/02* (2006.01)
  *H01L 39/24* (2006.01)

(52) U.S. Cl.
  CPC .. *H01L 21/76807* (2013.01); *H01L 21/76814* (2013.01); *H01L 21/76877* (2013.01); *H01L 21/76891* (2013.01); *H01L 23/5226* (2013.01); *H01L 39/2406* (2013.01)

(58) Field of Classification Search
  CPC .......... H01L 23/53285; H01L 23/5226; H01L 23/485; H01L 23/52; H01L 39/2406; H01L 39/025; H01L 39/2493
  See application file for complete search history.

(56) References Cited

U.S. PATENT DOCUMENTS

| | | | |
|---|---|---|---|
| 5,055,158 A | 10/1991 | Gallagher et al. | |
| 5,138,401 A | 8/1992 | Yamazaki | |
| 5,212,150 A | 5/1993 | Yamazaki | |
| 5,227,361 A | 7/1993 | Yamazaki | |
| 5,274,268 A | 12/1993 | Yamazaki | |
| 5,338,207 A | 8/1994 | Lineberry et al. | |
| 5,447,908 A | 9/1995 | Itozaki et al. | |
| 5,600,101 A | 2/1997 | Sakai | |
| 5,660,682 A * | 8/1997 | Zhao | H01L 21/02063 134/1.2 |
| 5,747,873 A | 5/1998 | Talisa et al. | |
| 5,818,071 A | 10/1998 | Loboda et al. | |
| 6,177,347 B1 | 1/2001 | Liu et al. | |
| 6,184,477 B1 | 2/2001 | Tanahashi | |
| 6,280,201 B1 | 8/2001 | Morris | |
| 6,344,616 B1 | 2/2002 | Yokokawa | |
| 6,378,757 B1 | 4/2002 | Holcombe et al. | |
| 6,402,525 B2 | 6/2002 | Gugliotti et al. | |
| 6,436,267 B1 * | 8/2002 | Carl | H01L 21/2885 205/123 |
| 6,482,656 B1 * | 11/2002 | Lopatin | H01L 21/288 257/E21.174 |
| 6,719,574 B2 | 4/2004 | Grek | |
| 6,926,190 B2 | 8/2005 | Jiang et al. | |
| 7,186,145 B1 | 3/2007 | Feldman et al. | |
| 7,259,091 B2 | 8/2007 | Schuehrer et al. | |
| 7,341,978 B2 | 3/2008 | Gu et al. | |
| 7,498,242 B2 | 3/2009 | Kumar et al. | |
| D611,014 S | 3/2010 | Huang | |
| 7,928,386 B2 * | 4/2011 | Frey | B82Y 20/00 250/336.2 |
| 8,241,701 B2 | 8/2012 | Dordi et al. | |
| 8,324,095 B2 | 12/2012 | Chung et al. | |
| 8,951,808 B2 | 2/2015 | Ladizinsky et al. | |
| 9,082,927 B1 | 7/2015 | Pramanik et al. | |
| 9,425,376 B2 * | 8/2016 | Greer | H01L 39/2493 |
| 9,472,878 B2 | 10/2016 | Costello et al. | |
| 9,634,224 B2 * | 4/2017 | Ladizinsky | H01L 39/223 |
| 9,653,398 B1 | 5/2017 | Kelliher et al. | |
| 9,780,285 B1 | 10/2017 | Kirby et al. | |
| 2003/0178474 A1 | 9/2003 | Jiang et al. | |
| 2004/0266209 A1 | 12/2004 | Hinode et al. | |
| 2006/0197193 A1 | 9/2006 | Gu et al. | |
| 2006/0273446 A1 | 12/2006 | Sato et al. | |
| 2007/0020921 A1 | 1/2007 | Chu et al. | |
| 2007/0037384 A1 | 2/2007 | Su et al. | |
| 2007/0037394 A1 | 2/2007 | Su et al. | |
| 2007/0059923 A1 | 3/2007 | Lee et al. | |
| 2007/0184656 A1 | 8/2007 | Sherman et al. | |
| 2007/0286254 A1 | 12/2007 | Fon et al. | |
| 2008/0272302 A1 * | 11/2008 | Frey | B82Y 20/00 250/336.2 |
| 2011/0241765 A1 | 10/2011 | Pesetski et al. | |
| 2012/0261788 A1 | 10/2012 | Lin et al. | |
| 2015/0011138 A1 | 4/2015 | Chang et al. | |
| 2015/0119252 A1 | 4/2015 | Ladizinsky et al. | |
| 2015/0143817 A1 | 5/2015 | Gervais et al. | |
| 2015/0179913 A1 | 6/2015 | Pramanik et al. | |
| 2015/0179914 A1 | 6/2015 | Greer et al. | |
| 2015/0179918 A1 * | 6/2015 | Greer | H01L 39/2493 505/329 |
| 2015/0187840 A1 | 7/2015 | Ladizinsky et al. | |
| 2015/0214093 A1 | 7/2015 | Dordi et al. | |
| 2015/0236235 A1 * | 8/2015 | Ladizinsky | H01L 39/223 505/190 |
| 2016/0148112 A1 | 5/2016 | Kwon | |
| 2017/0162513 A1 | 6/2017 | Kelliher et al. | |
| 2017/0373044 A1 * | 12/2017 | Das | H01L 25/0657 |

FOREIGN PATENT DOCUMENTS

| | | |
|---|---|---|
| JP | S63205972 A | 8/1988 |
| JP | 2005039244 A | 2/2005 |
| WO | 0213234 A2 | 2/2002 |
| WO | 2016025598 A1 | 2/2016 |
| WO | 2018/097925 A1 | 5/2018 |
| WO | 2018097925 A1 | 5/2018 |

OTHER PUBLICATIONS

Lyle Patrick et al: "Static Dielectric Constant of SiC" Physical Reivew B, vol. 3, No. 6, Sep. 1, 1970 (Sep. 1, 1970), pp. 2255-2256, XP055334620, ISSN: 0556-2805, DoI: 10.1103?PhysRevB.2.2255 table 1.

Yujiro Katoh et al: "No-Oxide-PB Tunnel Junctions Fabricated Using CF4 Cleaning Process. (III) Preparation of Planar DC Squid", Japanese Journal of Applied Physics, Japan Society of Applied Physics, JP, vol. 26, No. 10, Oct. 1, 1987 (Oct. 1, 1987), pp. 1657-1662, XP000112637, ISSN: 0021-4922, DOI: 10.1143/JJAP.26.1657 p. 1658, left-hand column, paragraph 3.

International Search Report corresponding to International Application No. PCT/US2017/043673, dated May 7, 2018.

Tolpygo, Sergey K., et al., "Process-induced Variability of Nb/Al/AlOx/Nb Junctions in Superconductor integrated Circuits and Protection Against It" IEEE on applied superconductivity, vol. 19, No. 3, Jun. 2009: 135-139.

Kerber, George L., et al., "Fabrication of high current density Nb integrated circuits using a self-aligned junction anodization process." IEEE transactions on applied superconductivity 13.2 (2003): 82-86.

Abelson, Lynn A., and George L Kerber. "Superconductor integrated circuit fabrication technology." Proceedings of the IEEE 92.10 (2004): 1517-1533.

International Search Report corresponding to International Application No. PCT/US2017/058494, dated Feb. 12, 2018, pp. 1-17.

* cited by examiner

PRECLEAN AND DEPOSITION METHODOLOGY FOR SUPERCONDUCTOR INTERCONNECTS

GOVERNMENT INTEREST

The invention was made under US Contract Number 30069413. Therefore, the US Government has rights to the invention as specified in that contract.

TECHNICAL FIELD

The present invention relates generally to superconductors, and more particularly to a preclean and deposition methodology for superconductor interconnects.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. One such fabrication process for formation of conductive contacts and lines is known as a dual damascene process. This technique has recently been attempted in the formation of superconducting circuits. During the fabrication of dual damascene superconducting circuits, via/trench structures are patterned, etched, filled with metal (e.g., niobium, tantalum, aluminum), then polished back using a chemical mechanical polishing (CMP) process. The next level dielectric is then deposited, and the sequence begins again, building up a multi-level interconnect stack. Any exposure to oxygen prior to deposition of the next dielectric layer can result in oxidization of the conductive contacts and lines, which degrades performance.

SUMMARY

In one example, a method is provided of forming a superconductor interconnect structure. The method comprises forming a dielectric layer overlying a substrate, forming an interconnect opening in the dielectric layer, and moving the substrate to a deposition chamber. The method further comprises performing a cleaning process on the top surface of the dielectric layer and in the interconnect opening while in the deposition chamber, and depositing a superconducting metal in the interconnect opening while in the deposition chamber to form a superconducting element in the superconductor interconnect structure.

In another example, a method is provided of forming a superconductor dual damascene structure. The method comprises forming a first dielectric layer overlying a substrate, forming a first superconducting element in the first dielectric layer, forming a second dielectric layer over the first dielectric layer and the first superconducting element, etching a contact opening in the second dielectric layer that extends to and exposes the first superconducting element in the first dielectric layer, and etching a conductive line opening in the second dielectric layer that overlies the contact opening to form a dual damascene opening. The method also comprises moving the structure to a deposition chamber, performing a cleaning process on the top surface of the second dielectric layer and in the dual damascene opening while in the deposition chamber, depositing a superconducting metal in the dual damascene opening while in the deposition chamber to form a dual damascene structure comprised of a contact and a second conductive line overlying and coupled to the contact, such that the contact connects the first conductive line to the second conductive line through the second dielectric layer.

In yet another example, a method of forming a superconductor interconnect structure is provided. The method comprises forming a dielectric layer overlying a substrate, forming an interconnect opening in the dielectric layer, and moving the substrate onto a temperature control chuck of a physical vapor deposition (PVD) chamber. The deposition chamber has a slab of superconducting niobium target material disposed on a top portion of the PVD. The method also comprises injecting Argon (AR) into the deposition chamber, setting the PVD chamber to an Inductively Coupled Plasma (ICP) mode resulting in an argon sputter etch on the top surface of the dielectric layer and the interconnect opening, and setting the PVD chamber to a Self Ionized Plasma (SIP) mode resulting in the depositing of superconducting niobium in the interconnect opening from the slab of superconducting niobium target material to form a superconducting element in the dielectric layer.

DETAILED DESCRIPTION

Figure 1:
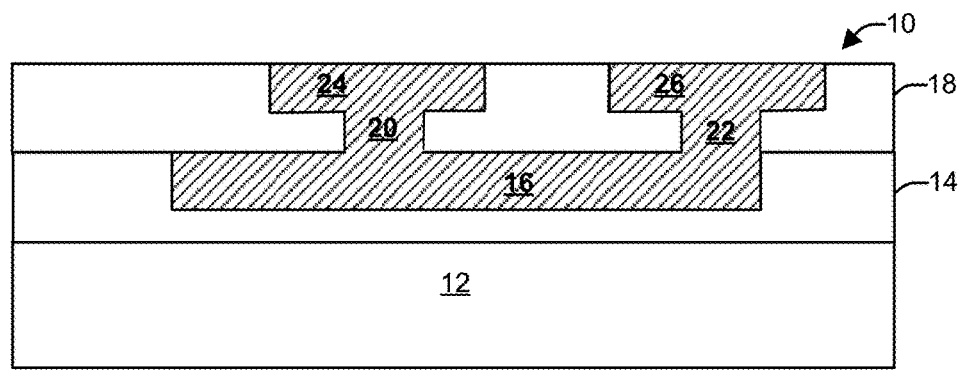
FIG. 1 illustrates cross-sectional view of a superconducting interconnect structure.

The present disclosure describes a system and method to preclean by sputter etching contaminants from a Silicon (Si), dielectric, or metal surface of a superconductor structure and the deposition of a superconducting metal within a single deposition chamber. This process is of particular significance with respect to eliminating surface oxides prior to metal deposition of superconducting metals. The removal of these surface oxides supports the following improvements in a superconducting electronics fabrication process: eliminating oxygen sources from interface which can diffuse into superconducting metallization (e.g., Niobium) during subsequent processing and reduce interconnect critical current (Ic) performance; eliminating unintended oxide layers during the deposition of Josephson Junction metallization which reduce the yield, uniformity, and repeatability of these structures; and the eliminating of high-loss interface oxides between dielectric material and superconducting traces which reduce the effective loss tangent of superconducting circuit elements.

In one example, a system is provided that includes a physical vapor deposition (PVD) platform that is configured to support both an independent pre-clean process and metal deposition process in a single PVD chamber. The intention of the system and method of the present disclosure is to eliminate unintended oxidation by establishing the capability to sputter etch surface oxides/contaminants and deposition metallization in a single chamber. This technique eliminates exposing a clean wafer surface to the oxidizing environment prior to metal deposition, for example, in transfer/buffer chambers employed in cluster tools.

In one example, the deposition chamber is configured to provide the capability of operating in an ICP (Inductively-Coupled Plasma) mode for removing the oxide surface layers, and SIP (Self-Ionized Plasma) mode for depositing a superconducting metal. The deposition chamber can allow for highly tunable coverage due to sputtering from a metal target as well as a coil with tunable deposition rate, ionization rate, and angular distribution of ionized metal atoms. Also, to control the wafer temperature, an electrostatic chuck (ESC), which uses thermal conduction to transfer heat to and from the wafer, provides repeatable results and tighter specifications of the film properties.

For example, in the formation of Josephson Junction metallization, deposition chamber etch processes ensure the removal of unintended interface oxides at the interface between the metal layers that constitute the junction stack. This results in improved junction yield, uniformity, and Jc targeting. In addition this will likely improve the I-V characteristics of these devices. The elimination of interface oxides using this type of etch process has been validated using SIMS to quantify oxygen concentration within the junction metal stack. For example, in the formation of low-loss transmission lines within a dielectric trench, the deposition chamber etch processes ensure the removal of unintended interface oxides at the interface between the dielectric and metal layers. This has been demonstrated to reduce the effective loss tangent of the transmission line by ~3×.

Certain cluster platforms are designed to support vacuum pressures between $10^{-7}$ and $10^{-8}$ Torr within the transfer and buffer chambers. The intent of maintaining these low pressures within the buffer and transfer chambers is to eliminate oxide growth on wafer surfaces following the pre-clean process as the wafer migrates through the system for subsequent processing. However, SIMS data has established that when a wafer is transferred between chambers, a thin layer of oxide can grow on the surface of the wafer during its exposure to either the transfer or buffer chambers.

SIMS data indicates a significant concentration of oxygen (O), carbon (C), and fluorine (F) at the interface between Niobium metal layers when the wafer was exposed to a transfer chamber environment for 2 minutes between the deposition of these films. In addition, SIMS data indicates a similarly high concentration of oxygen (O), carbon (C), and fluorine (F) at the interface between a substrate (Silicon) that has been processed through the pre-clean chamber and subsequent Niobium or Aluminum deposition that occurs following exposure of the wafer to both the buffer and transfer chamber environment.

The level of contamination that occurs in the buffer and transfer chambers of cluster platforms has a significant impact on the performance of superconducting electronic devices fabricated using this tool. In particular, residual interface contaminants (oxygen) can diffuse into superconducting metallization (Niobium) during subsequent processing and reduce interconnect critical current (Ic) performance. Unintended oxide layers during the deposition of Josephson Junction metallizations reduce the yield, uniformity, and repeatability of these structures. High-loss interface oxides between dielectric material and superconducting traces reduce the effective loss tangent of superconducting circuit elements.

In accordance, one example of the present disclosure, an Ar sputter etch and metal deposition process is combined into a single chamber eliminating exposure of the substrate to the transfer and/or buffer chamber environments following the sputter-clean process. This single-chamber etch/deposition process sequence eliminates accumulation of surface contaminants (oxygen (O), carbon (C), and fluorine (F)) that occurs in a typical process sequence as a wafer is transferred from chamber to chamber. In addition, the chamber can be equipped with an ESC chuck that improves the control of the substrate temperature relative to a standard pre-clean chamber which does not have a chuck to control wafer temperature during the sputter etch process.

It should be noted that the deposition process chambers can be maintained at a vacuum pressure similar to the buffer and transfer chamber (approximately $10^{-8}$ Torr). However, contaminant levels are likely significantly lower in the process chamber because of coating of metal that lines the chamber and acts as a getter for oxygen (O), carbon (C), and fluorine (F), preventing these materials from accumulating at interfaces or in the deposited films. This metal sidewall coating is replenished following every deposition, always presenting a fresh surface for trapping contaminants. In contrast, buffer and transfer chambers are not able to be coated with new metal prior to processing a wafer.

Furthermore, the deposition chambers can be equipped with bakeout lamps that maintain the chamber and target at an elevated temperature when the chamber is in an idle state. This elevated temperature reduces moisture levels within the chamber (a source of oxygen contamination). In contrast, transfer and buffer chambers are not equipped with heat lamps; therefore, making these chambers more susceptible to accumulation of moisture.

FIG. 1 illustrates cross-sectional view of a superconductor interconnect structure 10. The superconductor interconnect structure 10 includes a first dielectric layer 14 overlying a substrate 12, and a second dielectric layer 18 overlying the first dielectric layer 14. The substrate 12 can be formed of silicon, glass or other substrate material. Both the first and the second dielectric layers 14 and 18 can be formed of a low temperature dielectric material that can be employed in low temperatures (e.g., less than or equal to 160 degrees Celsius) typically utilized in the formation of superconducting devices. A first conductive line 16 is embedded in the first dielectric layer 14. A first conductive contact 20 extends from the first conductive line 16 at a first end to a second conductive line 24 in the second dielectric layer 18, and a second conductive contact 22 extends from the first conductive line 16 at a second end to a third conductive line 26 in the second dielectric layer 18. Each of the contacts and conductive lines are formed of a superconducting material, such as niobium. A cleaning process as described herein is performed on a top surface of the first conductive line 16 prior to deposition of the conductive contacts 20 and 22, and the conductive lines 24 and 26 in the same vapor deposition chamber to mitigate oxides that can form on a top surface of the first conductive line 16.

Turning now to FIGS. 2-12, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. The present example will be illustrated with respect to a single damascene trench etched into a dielectric thin film to form a bottom conductive line followed by a dual damascene process to form top conductive lines.

Figure 2A:
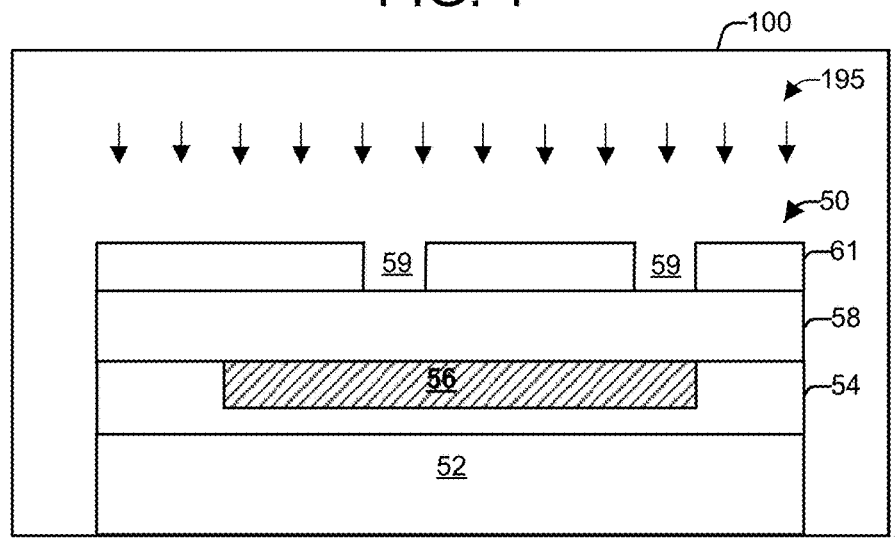
FIG. 2 illustrates a schematic cross-sectional view of an example of a superconductor structure having a patterned photoresist material layer and undergoing an etch process in an etch chamber.
Figure 2B:
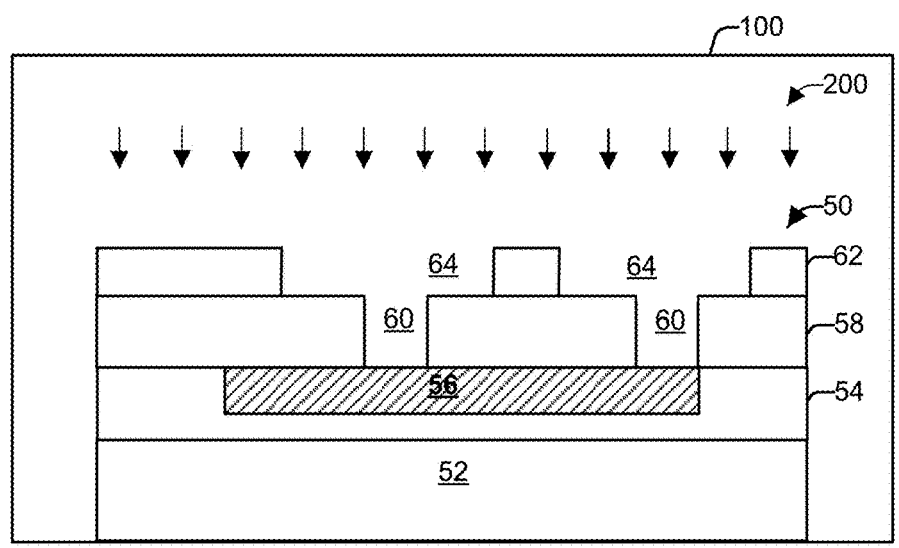

FIG. 2 illustrates a cross-sectional view of a superconductor structure 50 in its early stages of fabrication. The superconductor structure 50 resides in an etch chamber 100 for forming vias and trenches in one or more dielectric layers. The superconductor structure 50 includes a first dielectric layer 54, that overlays an underlying substrate 52. The underlying substrate 52 can be, for example, a silicon or glass wafer that provides mechanical support for the first dielectric layer and subsequent overlying layers. A second dielectric layer 58 is formed over the first dielectric layer 54. Any suitable technique for forming the first and second dielectric layers may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. A conductive line 56 resides within the first dielectric layer 54 and has a top surface that is flush with a top surface of the first dielectric layer 54. The conductive line 56 can be formed in a single damascene process, and goes through a cleaning process prior to deposition of the next dielectric layer.

The second dielectric layer 58 overlies the first dielectric layer 54 and includes a pair of vias 60 that extend from a top surface of the second dielectric layer 58 to a top surface of the conductive line 56 that resides in the first dielectric layer 54. The pair of vias 60 could have been formed in a first portion of a dual damascene process. FIG. 2 illustrates a beginning formation of a second portion of the dual damascene process. As illustrated in FIG. 2, a photoresist material layer 62 has been applied to cover the structure, which is then patterned and developed to expose trench openings 64 in the photoresist material layer 62 in accordance with a trench pattern. The photoresist material layer 62 can have a thickness that varies in correspondence with the wavelength of radiation used to pattern the photoresist material layer 62. The photoresist material layer 62 may be formed over the second dielectric layer 58 via spin-coating or spin casting deposition techniques, selectively irradiated (e.g., via deep ultraviolet (DUV) irradiation) and developed to form the trench openings 64.

FIG. 2 also illustrates performing of an etch 200 (e.g., anisotropic reactive ion etching (RIE)) on the second dielectric layer 58 to form extended trench openings 66 (FIG. 3) in the second dielectric layer 58 based on the trench pattern in the photoresist material layer 62. The etch step 200 can be a dry etch and employ an etchant which selectively etches the underlying second dielectric layer 58 at a faster rate than the underlying conductive line 56 and the overlying photoresist material layer 62. For example, the second dielectric layer 58 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern on the photoresist material layer 62 to thereby create the extended trench openings 66. The photoresist material layer 62 is thereafter stripped (e.g., ashing in an $O_2$ plasma) so as to result in the structure shown in FIG. 3.

Figure 3:
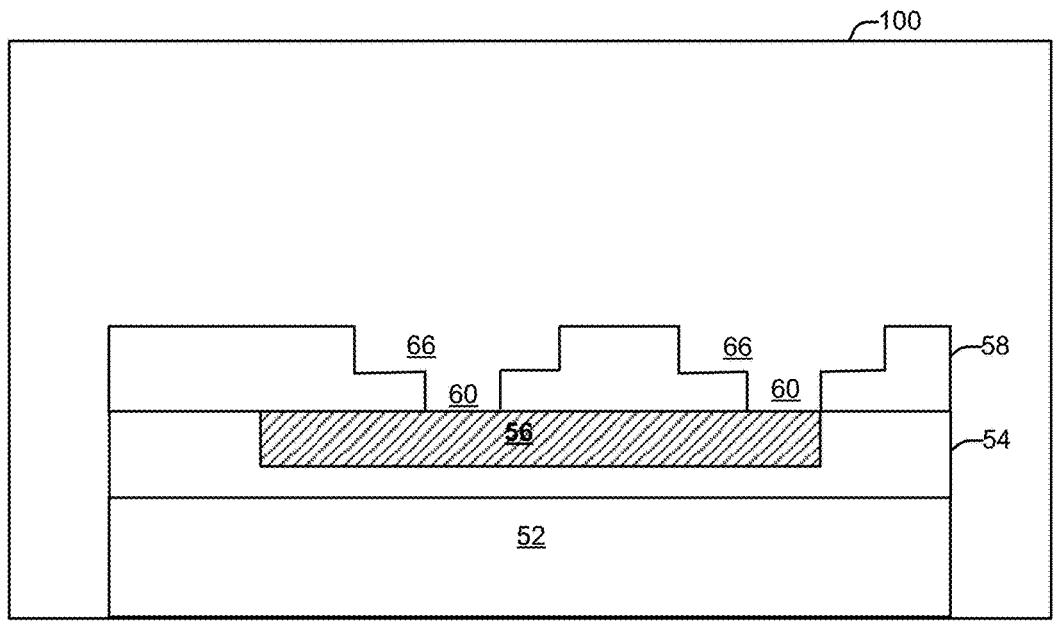
FIG. 3 illustrates a schematic cross-sectional view of the structure of FIG. 2 after the etch process and after the photoresist material layer has been stripped.
Figure 4:
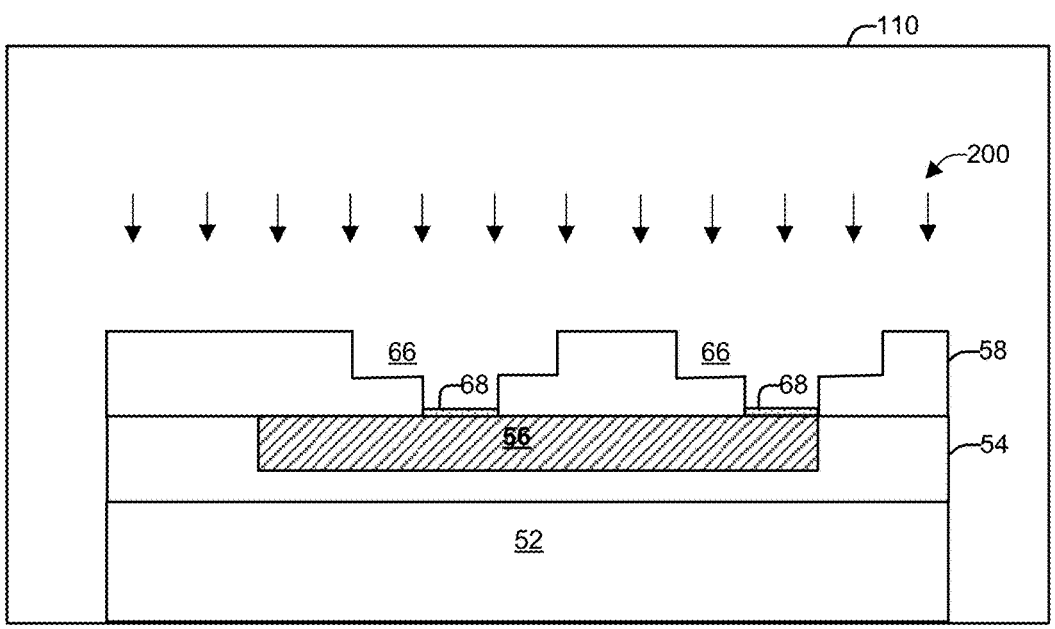
FIG. 4 illustrates a schematic cross-sectional view of the structure of FIG. 3 after being transferred to a deposition chamber and undergoing a preclean process in the deposition chamber.

The structure of FIG. 3 is then moved from the etch chamber 100 to a deposition chamber 110, as illustrated in FIG. 4. The deposition chamber 110 can be a physical vapor deposition chamber on, for example, a cluster tool. In some previous implementations, the etched structure is put in a preclean chamber to remove oxides from the superconducting metals during processing prior to depositon. The structure is then transferred from the etch chamber to the deposition chamber via one or more transfer/buffer chambers in, for example, a cluster tool. However, during the transfer of the structure through one or more transfer/buffer chambers, oxides still build up on the superconducting metal resulting in an oxidized superconducting metal degrading performance.

In an example of the present disclosure, the etched structure is precleaned in the deposition chamber during a first mode, and then undergoes a deposition process during a second mode. In this manner, the structure is not subjected to oxidation of the underlying first conductive line 56 that is exposed through openings in the second dielectric layer 58 during transfer of the structure to the deposition chamber. Additionally, any oxides on the surface of the second dielectric layer 58 will also be etched away.

As illustrated in FIG. 4, a metal-oxide layer 68 has formed on a surface of the first superconducting line in the vias 60. This metal-oxide layer 68 has a deleterious effect on the superconducting properties of the first conductive line 56.

Therefore, a cleaning process is performed to remove the resultant oxide on the surface of the superconducting line 56 via a sputter etch in the deposition chamber 110. To implement an in-deposition chamber pre-clean immediately prior to metal deposition, the deposition chamber is configured to operate in an ICP (Inductively-Coupled Plasma) mode for removing the metal-oxide layer 68, and other oxides that form on the second dielectric layer 58.

Figures 9, 10:
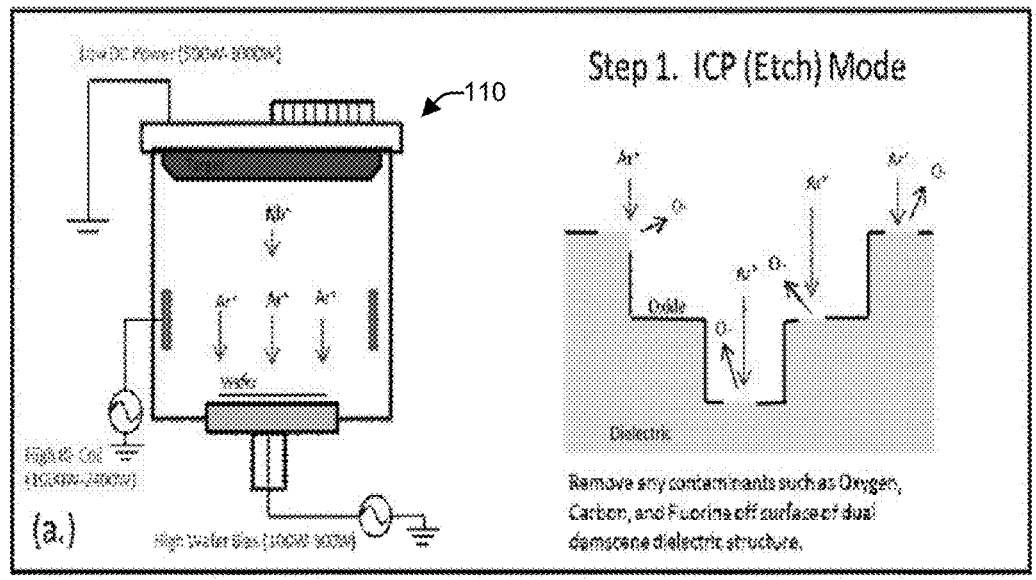
FIG. 9 illustrates a zoomed in cross-sectional view of the deposition chamber during the preclean process showing the bombardment of argon ions onto the surface of the superconductor structure.
FIG. 10 illustrates a zoomed in cross-sectional view of the via and trench opening, and the bombardment of argon ions onto the surface of the superconductor structure.

As shown in FIG. 9, the deposition chamber recipe initiates the process in etch mode to remove any native oxides or impurities that were left behind on the surface of the wafer including the metal-oxide layer 68. The deposition is setup with a slab of target material, such as niobium (Nb), disposed on a top surface of the chamber 110, and a wafer disposed on a temperature controlled chuck. To operate the deposition chamber 110 in sputter etch mode, the following settings can be applied: (1) DC power applied to the target material is set to be as low as possible (e.g., about 500 Watts to about 1000 Watts) to provide minimal deposition onto the wafer, (2) AC bias applied to the wafer is set to be high enough (e.g., about 100 Watts to about 500 Watts) to impinge energetic ions on the exposed material on the substrate to permanently remove unwanted material, and (3) RF Coil is set to be high enough (e.g., about 1000 Watts to about 2400 Watts) to increase Argon (Ar) ionization to increase etch rate and overcome the deposition rate of the Nb. FIG. 10 illustrates a zoomed in view of the via and trench opening, and shows the bombardment of argon ions onto the surface of the opening and how it removes oxygen, carbon and fluorine contaminants off the surface of the opening and underlying layer (not shown).

Figure 5:
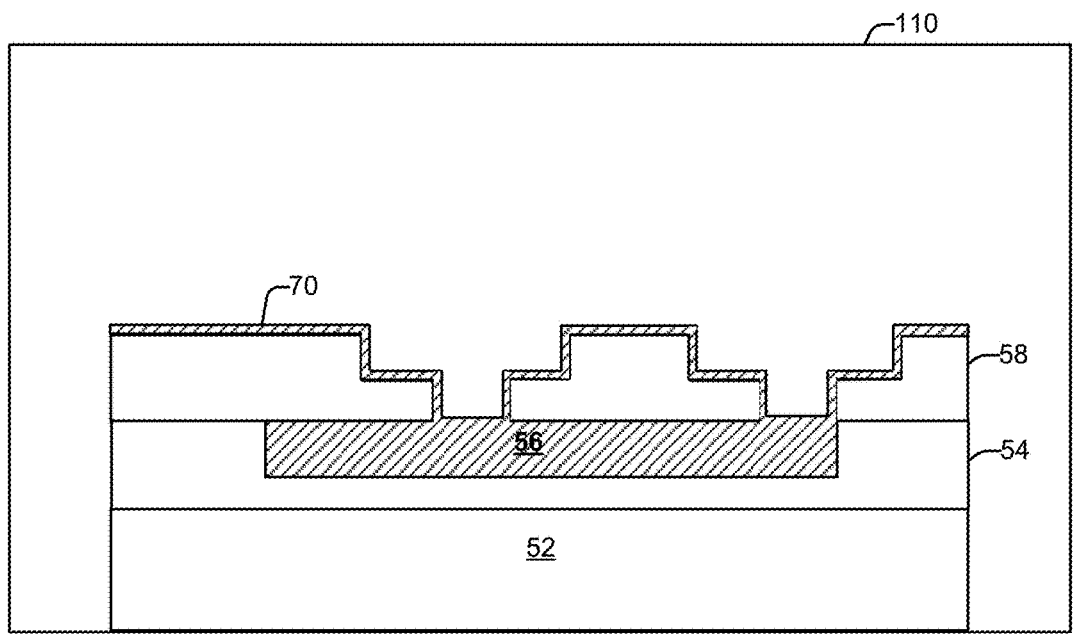
FIG. 5 illustrates a schematic cross-sectional view of the structure of FIG. 4 after undergoing deposition of a superconductor liner in the deposition chamber.

Following the sputter etch process, the etch chamber 110 enters deposition mode, and initiates the metal deposition process by depositing a layer or liner 70 of superconducting material over the first conductive line 56, the walls of the via 60 and the trench opening 66, as well as a top surface of the second dielectric layer 58, as illustrated in FIG. 5. A number of subsequent intermediate superconducting material layers 72 are then deposited over the superconducting liner 70 to provide the resultant structure shown in FIG. 6. Furthermore, a number of subsequent final superconducting layers 74 are deposited over the intermediate superconducting material layers 72 to form the resultant structure of FIG. 7. Following deposition of the contact material fill, the superconducting material 74 is placed into a polish platen 120 and is polished via chemical mechanical polishing (CMP) down to the surface level of the dielectric layer 58 to form a first contact 76, a second conductive line 78, a second contact 80, and a third conductive contact 82 that form part of the metal interconnects and provide the resultant structure of FIG. 8.

Figure 6:
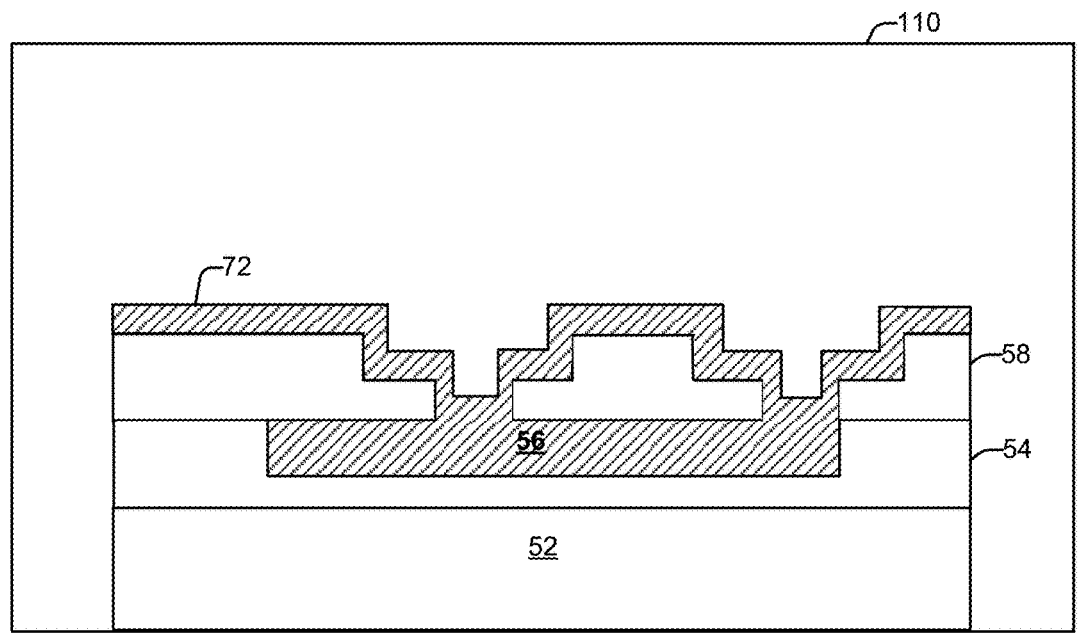
FIG. 6 illustrates a schematic cross-sectional view of the structure of FIG. 5 after a contact material fill to deposit a number of subsequent intermediate superconducting material layers in the deposition chamber.
Figure 7:
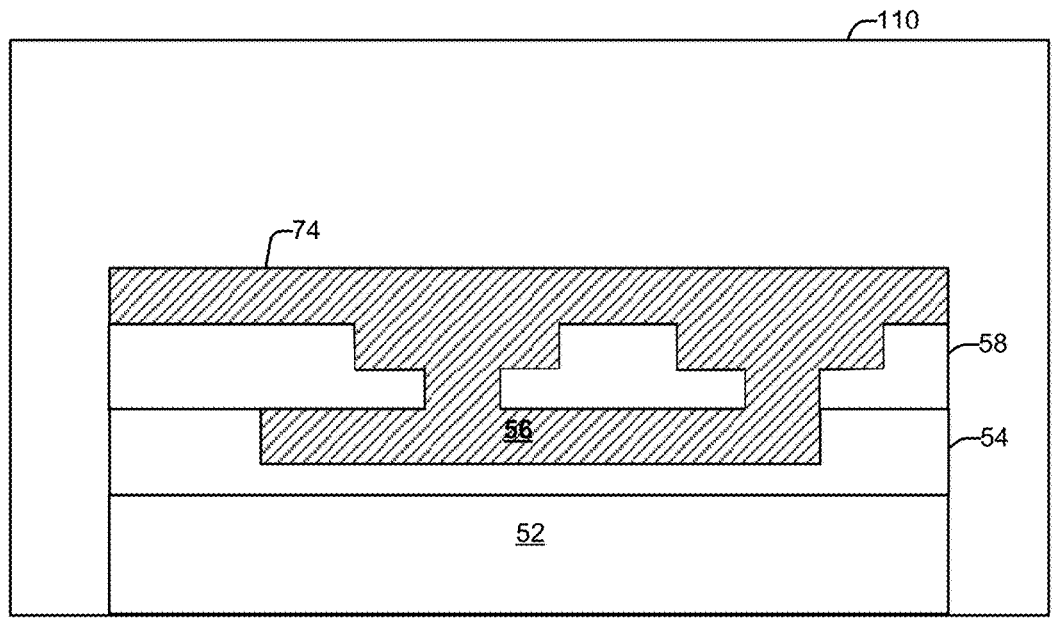
FIG. 7 illustrates a schematic cross-sectional view of the structure of FIG. 6 after a contact material fill to deposit a number of final intermediate superconducting material layers in the deposition chamber.
Figure 8:
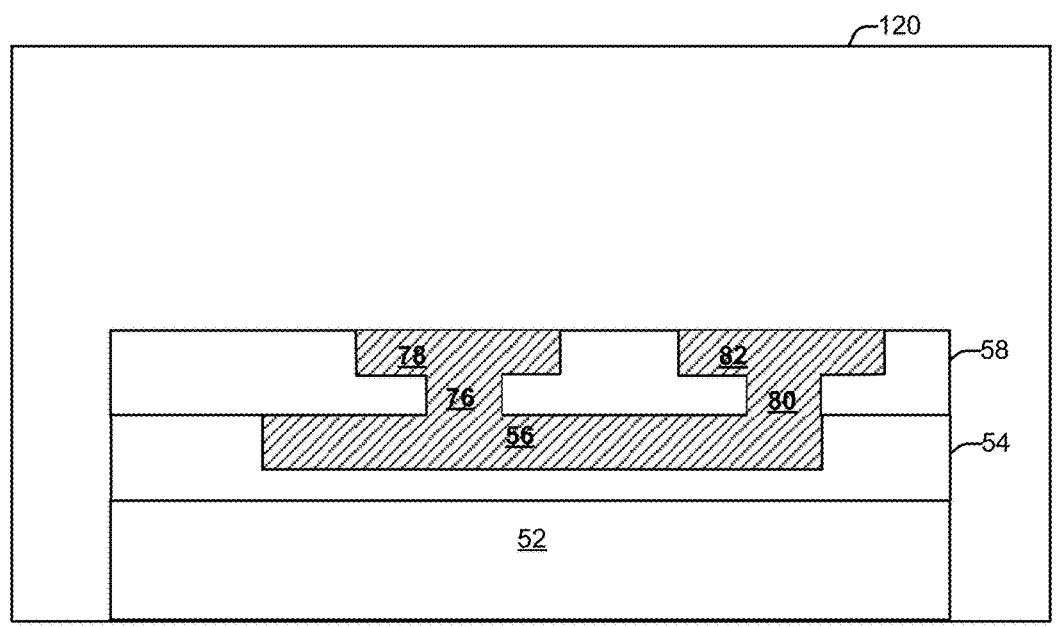
FIG. 8 illustrates a schematic cross-sectional view of the structure of FIG. 7 after undergoing a chemical mechanical polish.
Figures 11, 12:
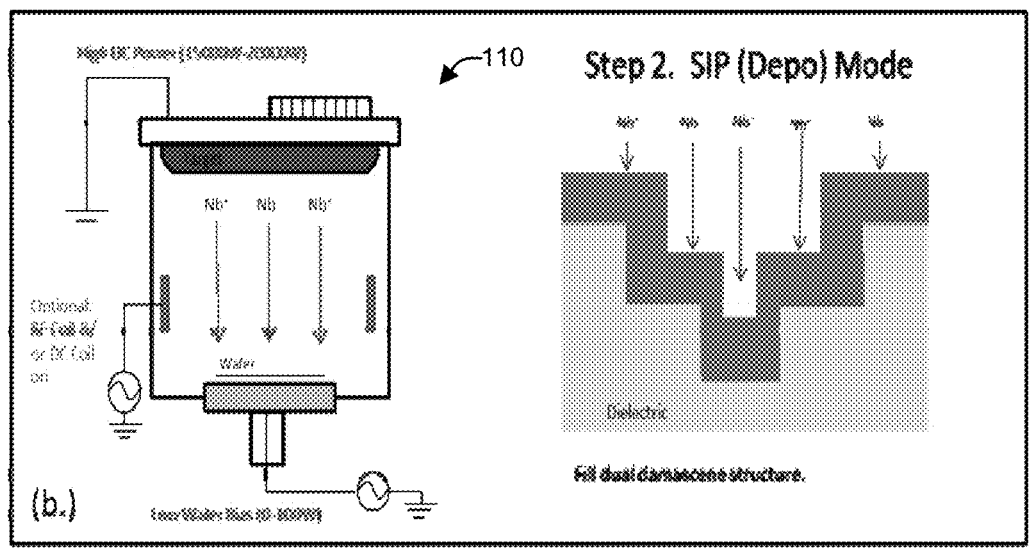
FIG. 11 illustrates a zoomed in cross-sectional view of the deposition chamber during the deposition process showing the deposition of niobium ions onto the surface of the superconductor structure.
FIG. 12 illustrates a zoomed in cross-sectional view of the via and trench opening, and the deposition process showing the deposition of niobium ions onto the surface of the superconductor structure.

As shown in FIG. 11, the deposition chamber 110 utilizes the following settings in deposition mode for the deposition methodology illustrated in FIGS. 5-7: (1) DC power applied to the target must be high enough (e.g., about 15000 Watts to about 20000 Watts) to sputter from target material and onto wafer surface, (2) AC Bias applied to the wafer should be low enough (e.g., 0 Watts to about 100 Watts) to provide a linear directionality to the ionized metal flux for good bottom coverage, without causing too much resputter, and (3) RF Coil and DC Coil are optional settings that can be kept off or turned on depending on process needs. FIG. 12 illustrates a zoom in view of the via and trench opening being filled with Niobium ions to result in the deposition of a superconducting Niobium material layer filling the via and trenches and covering the overlying second dielectric layer prior to the CMP process of FIG. 8.

Figure 13:
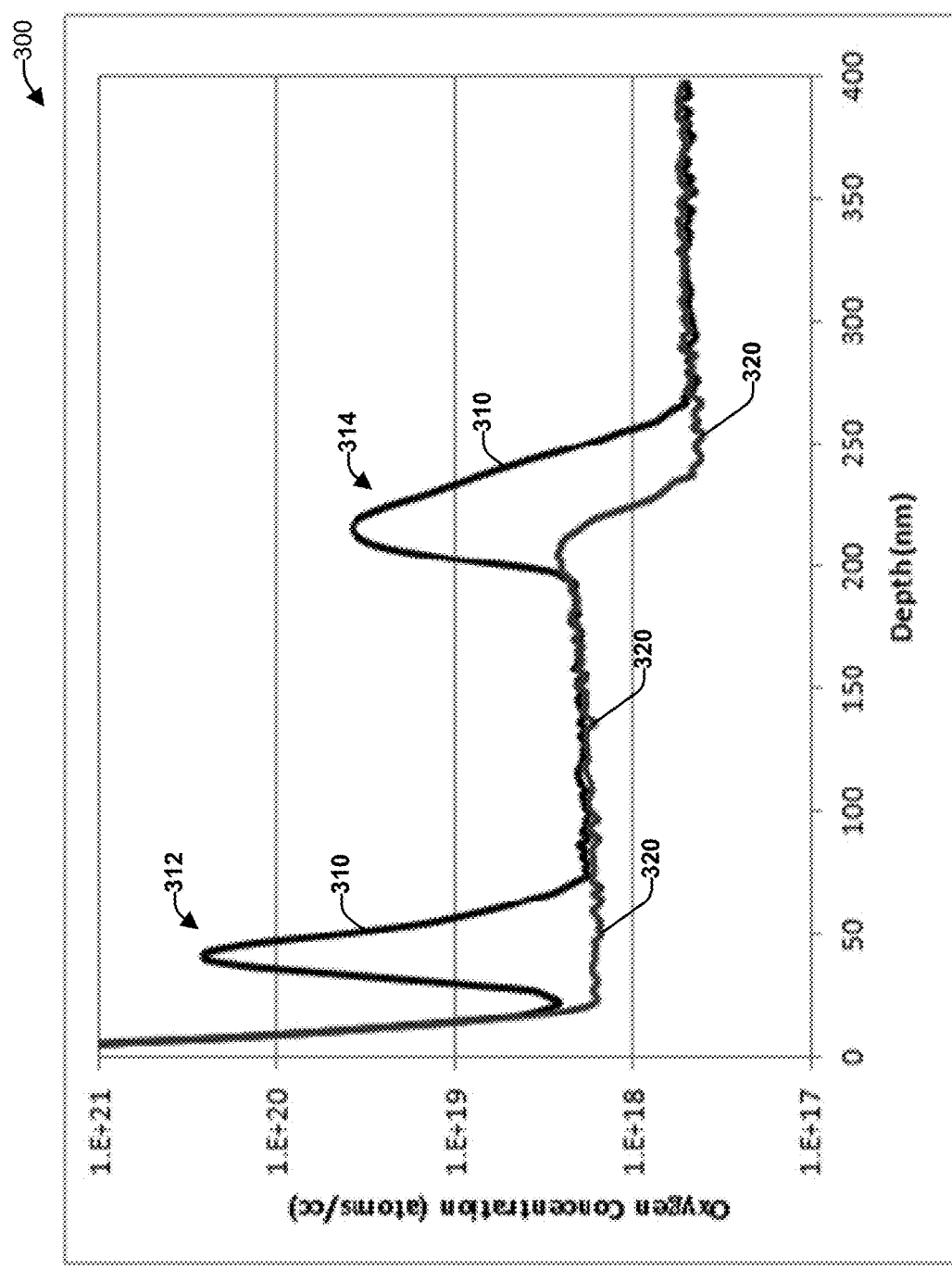
FIG. 13 illustrates a SIMS graph of Oxygen Concentration (atoms/CC) versus Depth (nm) comparing the single-chamber preclean/deposition process versus multiple chamber pre-clean/deposition process

FIG. 13 illustrates a SIMS graph 300 of Oxygen Concentration (atoms/CC) versus Depth (nm) comparing the single-chamber preclean/deposition process versus multiple chamber preclean/deposition process. The SIMS 300 data indicates that in the case of using the multiple chamber pre-clean/deposition process there are significant concentrations of oxygen at the substrate (Silicon)-metal (Niobium) interface (trace 310 with peak 312 at approximately 225 nm) and at a metal (Niobium)-metal (Niobium) interface (peak 314 at approximately 50 nm). In contrast, implementing the single-chamber preclean/deposition process described in this disclosure, the oxygen at both the substrate (Silicon)-metal (Niobium) interface and the metal (Niobium)-metal (Niobium) interface (trace 320) are eliminated.

The SIMS data indicates using the method described in this disclosure eliminates high-loss interface oxides between dielectric material and superconducting traces which reduce the effective loss tangent of superconducting circuit elements, and implementing the single-chamber preclean/deposition process described in this disclosure has demonstrated a 3× reduction in the effective loss tangent of a transmission line.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor interconnect structure, the method comprising:
    forming a dielectric layer overlying a substrate;
    forming an interconnect opening in the dielectric layer;
    moving the substrate to a deposition chamber, wherein the deposition chamber is a physical vapor deposition (PVD) chamber;
    performing a cleaning process on the top surface of the dielectric layer and in the interconnect opening while in the deposition chamber, wherein the PVD chamber is configured in an Inductively Coupled Plasma (ICP) mode; and
    depositing a superconducting metal in the interconnect opening while in the deposition chamber to form a superconducting element in the superconductor interconnect structure wherein the PVD chamber is configured in a Self Ionized Plasma (SIP) mode.

2. The method of claim 1, wherein the superconductor interconnect element is formed from niobium that resides as a target slab material in the deposition chamber.

3. The method of claim 1, further comprising performing a chemical mechanical polish (CMP) to align a top surface of the superconductor interconnect element with a top surface of the first dielectric layer.

4. The method of claim 1, wherein the dielectric layer is a second dielectric layer that overlays a first dielectric layer having a first conductive line, and the interconnect opening is a dual damascene structure, such that the superconductor interconnect element is both a second conductive line and a contact that connects the first conductive line to the second conductive line through the second dielectric layer.

5. The method of claim 1, wherein the cleaning process is a sputter etch process.

6. The method of claim 5, wherein the cleaning process is an argon sputter etch process.

7. The method of claim 1, wherein the superconductor interconnect structure is part of a wafer that resides on a temperature control chuck during performing of the cleaning process and the depositing of a superconducting metal.

8. The method of claim 7, wherein the cleaning process comprises:
- injecting Argon (AR) into the deposition chamber;
- setting a DC power applied to a slab of superconducting target material to about 500 Watts to about 1000 Watts to provide minimal deposition of the superconducting target material;
- setting AC power applied to the wafer to be about 100 Watts to about 500 Watts; and
- setting the RF Coil to about 1000 Watts to about 2400 Watts to increase Argon (AR) ionization and increase etch rate on the oxides residing in the interconnect opening to overcome the deposition rate of the superconducting target material.

9. The method of claim 7, wherein the depositing a superconducting metal process comprises:
- setting DC power applied to a slab of superconducting target material to about 15000 Watts to about 20000 Watts to be high enough to sputter target material onto the dielectric layer and into the interconnect opening; and
- setting AC bias applied to the wafer to be about 0 Watts to about 100 Watts to be low enough to provide a linear directionality to the ionized metal.

10. A method of forming a superconductor dual damascene structure, the method comprising:
- forming a first dielectric layer overlying a substrate;
- forming a first superconducting element in the first dielectric layer;
- forming a second dielectric layer over the first dielectric layer and the first superconducting element;
- etching a contact opening in the second dielectric layer that extends to and exposes the first superconducting element in the first dielectric layer;
- etching a conductive line opening in the second dielectric layer that overlies the contact opening to form a dual damascene opening;
- moving the structure to a deposition chamber;
- performing a cleaning process on the top surface of the second dielectric layer and in the dual damascene opening while in the deposition chamber;
- depositing a superconducting metal in the dual damascene opening while in the deposition chamber to form a dual damascene structure comprised of a contact and a second conductive line overlying and coupled to the contact, such that the contact connects the first conductive line to the second conductive line through the second dielectric layer.

11. The method of claim 10, wherein the dual damascene structure is formed from niobium that resides as a target slab material coupled to the deposition chamber.

12. The method of claim 10, further comprising performing a chemical mechanical polish (CMP) to align a top surface of the second conductive line with a top surface of the second dielectric layer.

13. The method of claim 10, wherein the deposition chamber is a physical vapor deposition (PVD) chamber that is configured in an Inductively Coupled Plasma (ICP) mode during the cleaning process and that is configured in a Self Ionized Plasma (SIP) mode during the depositing a superconducting metal.

14. The method of claim 10, wherein the superconductor interconnect structure is part of a wafer that resides on a temperature control chuck while in the deposition chamber.

15. The method of claim 14, wherein the cleaning process comprises:
- injecting Argon (AR) into the deposition chamber;
- setting DC power applied to a slab of superconducting target material to about 500 Watts to about 1000 Watts to provide minimal deposition of the superconducting target material;
- setting AC power applied to the wafer to be about 100 Watts to about 500 Watts;
- setting the RF Coil to about 1000 Watts to about 2400 Watts to increase Argon (AR) ionization and the etch rate on the oxides of the second dielectric layer and the dual damascene opening to overcome the deposition rate of the superconducting target material.

16. The method of claim 15, wherein the depositing a superconducting metal process comprises:
- setting DC power applied to the slab of superconducting target material to about 15000 Watts to about 20000 Watts to be high enough to sputter target material into the dual damascene opening; and
- setting AC bias applied to the wafer to be about 0 Watts to about 100 Watts to be low enough to provide a linear directionality to the ionized metal flux.

17. A method of forming a superconductor interconnect structure, the method comprising:
- forming a dielectric layer overlying a substrate;
- forming an interconnect opening in the dielectric layer;
- moving the substrate onto a temperature control chuck of a physical vapor deposition (PVD) chamber, which contains a slab of superconducting niobium target material disposed on a top portion of the PVD;
- injecting Argon (AR) into the deposition chamber;
- setting the PVD chamber to an Inductively Coupled Plasma (ICP) mode resulting in an argon sputter etch on the top surface of the dielectric layer and the interconnect opening; and
- setting the PVD chamber to a Self Ionized Plasma (SIP) mode resulting in the depositing of superconducting niobium in the interconnect opening from the slab of superconducting niobium target material to form a superconducting element in the dielectric layer.

18. The method of claim 17, wherein setting the PVD chamber to an ICP mode comprises:
- setting DC power applied to a slab of superconducting target material to about 500 Watts to about 1000 Watts to provide minimal deposition of the superconducting target material;
- setting AC power applied to the substrate to be about 100 Watts to about 500 Watts; and
- setting the RF Coil to about 1000 Watts to about 2400 Watts to increase Argon (AR) ionization and increase etch rate on the oxides on the dielectric layer and in the interconnect opening to overcome the deposition rate of the superconducting target material.

19. The method of claim 17, wherein setting the PVD chamber to a SIP mode comprises:
- setting DC power applied to a slab of superconducting target material to about 15000 Watts to about 20000 Watts to be high enough to sputter target material into the interconnect opening; and
- setting AC bias applied to the wafer to be about 0 Watts to about 100 Watts to be low enough to provide a linear directionality to the ionized metal flux.

20. A method of forming a superconductor interconnect structure, the method comprising:
- forming a dielectric layer overlying a substrate on a wafer;
- forming an interconnect opening in the dielectric layer;
- moving the substrate to a deposition chamber onto a temperature control chuck;
- performing a cleaning process on the top surface of the dielectric layer and in the interconnect opening while in the deposition chamber; and
- depositing a superconducting metal in the interconnect opening while in the deposition chamber to form a superconducting element in the superconductor interconnect structure.

* * * * *